(12) United States Patent
Yeh et al.

(10) Patent No.: US 9,780,099 B1
(45) Date of Patent: Oct. 3, 2017

(54) LAYOUT PATTERN FOR STATIC RANDOM ACCESS MEMORY

(71) Applicant: UNITED MICROELECTRONICS CORP., Hsin-Chu (TW)

(72) Inventors: Shu-Wei Yeh, Taichung (TW); Tsung-Hsun Wu, Kaohsiung (TW); Chih-Ming Su, Tainan (TW); Zhi-Xian Chou, Pingtung County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/233,961

(22) Filed: Aug. 11, 2016

(30) Foreign Application Priority Data

Jul. 4, 2016 (TW) .............................. 105121078 A (51) Int. Cl.
| | | |
|---|---|---|
| *G11C 11/04* | (2006.01) |
| *H01L 27/11* | (2006.01) |
| *H01L 29/78* | (2006.01) |
| *H01L 27/02* | (2006.01) |
| *G11C 11/412* | (2006.01) |

(52) U.S. Cl.
CPC ........ *H01L 27/1104* (2013.01); *G11C 11/412* (2013.01); *H01L 27/0207* (2013.01); *H01L 29/785* (2013.01)

(58) Field of Classification Search
CPC ............... G11C 11/412; H01L 27/0924; H01L 27/0886; H01L 27/1104; H01L 27/0207; H01L 27/088; H01L 27/0922; H01L 27/092; H01L 27/1052; H01L 27/11; H01L 27/11565; H01L 27/11807
See application file for complete search history.

(56) References Cited

U.S. PATENT DOCUMENTS

| | | | |
|---|---|---|---|
| 8,189,368 B2 | 5/2012 | Liaw | |
| 8,315,084 B2 | 11/2012 | Liaw | |
| 8,675,397 B2 | 3/2014 | Liaw | |
| 2010/0006945 A1* | 1/2010 | Merelle | .......... H01L 21/823418 257/368 |
| 2011/0018064 A1* | 1/2011 | Doornbos | .......... H01L 27/0207 257/365 |
| 2013/0181297 A1* | 7/2013 | Liaw | ..................... G11C 11/412 257/390 |
| 2015/0357279 A1* | 12/2015 | Fujiwara | ............. G06F 17/5077 257/499 |

OTHER PUBLICATIONS

Yeh, Title of Invention: Layout Pattern for Static Random Access Memory, U.S. Appl. No. 15/186,548, filed Jun. 20, 2016.

* cited by examiner

*Primary Examiner* — Son Dinh
*Assistant Examiner* — Uyen B Tran
(74) *Attorney, Agent, or Firm* — Winston Hsu (57) ABSTRACT

A layout pattern of a static random access memory includes a pull-up device, a first pull-down device, a second pull-up device, a second pull-down device, a first pass gate device, a second pass gate device, a third pass gate device and a fourth pass gate device disposed on a substrate. A plurality of fin structures is disposed on the substrate, the fin structures including at least one first fin structure and at least one second fin structure. A step-shaped structure is disposed on the substrate, including a first part, a second part and a bridge part. A first extending contact feature crosses over the at least one first fin structure and the at least one second fin structure.

10 Claims, 7 Drawing Sheets

LAYOUT PATTERN FOR STATIC RANDOM ACCESS MEMORY

BACKGROUND OF THE INVENTION

1. Field of the Invention

The invention relates to a static random access memory (SRAM), and more particularly, to a SRAM having the advantages of higher yield and faster read speed.

2. Description of the Prior Art

An embedded static random access memory (SRAM) comprises a logic circuit and a static random access memory connected to the logic circuit. SRAM is a kind of volatile memory cell, which means it preserves data only while power is continuously applied. SRAM is built of cross-coupled inverters that store data during the time that power remains applied, unlike dynamic random access memory (DRAM) that needs to be periodically refreshed. Because of its high access speed, SRAM is also used in computer systems as a cache memory.

However, as pitch of the exposure process decreases, it has been difficult for the current SRAM architecture to produce desirable patterns. Hence, how to enhance the current SRAM architecture for improving exposure quality has become an important task in this field.

SUMMARY OF THE INVENTION

The present invention provides a layout pattern of a static random access memory, includes a first inverter and a second inverter cross-coupled for data storage, each inverter including at least one pull-up device (PLs) and at least one pull-down devices (PDs), at least two pass gate devices (PGs) configured with the two cross-coupled inverters respectively, wherein each of the at least one pull-up device (PLs), the at least one pull-down devices (PDs), and the at least two pass gate devices (PGs) includes a fin field-effect transistor (FinFET), a plurality of fin structures disposed on the substrate, the fin structures comprising at least one first fin structure, at least one second fin structure, at least one third fin structure, at least one fourth fin structure and at least one fifth fin structure, each inverter comprising a step-shaped structure disposed on the substrate, the step-shaped structure comprising a first part and a second part arranged along a first direction, and a bridge part connected to the first part and the second part, the bridge part is arranged along a second direction, wherein the first direction is perpendicular to the second direction, and wherein the first part crosses over the at least one first fin structure, and the second part crosses over the at least one second fin structure to form the at least one pull-down devices (PDs), wherein the first part crosses over the at least one third fin structure to form the at least one pull-up devices (PLs), each inverter comprising a first pass gate structure and a second pass gate structure disposed on the substrate, the first pass gate structure and the first part of the step-shaped structure being arranged along a same direction, and the first pass gate structure and the first part of the step-shaped structure comprising a same symmetry axis, the second pass gate structure and the second part of the step-shaped structure being arranged along a same direction, and the second pass gate structure and the second part of the step-shaped structure comprising a same symmetry axis, wherein the first pass gate structure crosses over the at least one fourth fin structure to form one of the two pass gate devices (PGs), and the second pass gate structure crosses over the at least one fifth fin structure to form another one of the two pass gate devices (PGs), and a first extending contact structure crossing over the at least one first fin structure and the at least one second fin structure.

The present invention further provides a layout pattern of a static random access memory, includes a first inverter and a second inverter cross-coupled for data storage, each inverter including at least one pull-up device (PLs) and at least one pull-down devices (PDs), at least two pass gate devices (PGs) configured with the two cross-coupled inverters respectively, wherein each of the at least one pull-up device (PLs), the at least one pull-down devices (PDs), and the at least two pass gate devices (PGs) includes a fin field-effect transistor (FinFET), a plurality of diffusion regions disposed on the substrate, the diffusion regions comprising at least one first diffusion region, at least one second diffusion region and at least one third diffusion region, each inverter comprising a step-shaped structure disposed on the substrate, the step-shaped structure comprising a first part and a second part arranged along a first direction, and a bridge part connected to the first part and the second part, the bridge part is arranged along a second direction, wherein the first direction is perpendicular to the second direction, and wherein the first part crosses over the at least one first diffusion region, and the second part crosses over the at least one second diffusion region to form the at least one pull-down devices (PDs), wherein the first part crosses over the at least one third diffusion region to form the at least one pull-up devices (PLs), each inverter comprising a first pass gate structure and a second pass gate structure disposed on the substrate, the first pass gate structure and the first part of the step-shaped structure being arranged along a same direction, and the first pass gate structure and the first part of the step-shaped structure comprising a same symmetry axis, the second pass gate structure and the second part of the step-shaped structure being arranged along a same direction, and the second pass gate structure and the second part of the step-shaped structure comprising a same symmetry axis, wherein the first pass gate structure crosses over the at least one first diffusion region to form one of the two pass gate devices (PGs), and the second pass gate structure crosses over the at least one second diffusion region to form another one of the two pass gate devices (PGs), and a first extending contact structure crossing over the at least one first diffusion region and the at least one second diffusion region.

A key feature of the present invention is the gate structure of the pull-down device PDs is not limited to being a strip-shaped structure, and it can be designed to be a step-shaped structure or other shapes. In this way, in a limited range, the gate can cross more fin structures. This increases the channel width of the first pull-down device PDs, and the read current (Iread) of one first pull-down device PD1 can also be improved, so as to improve the read speed of the first pull-down device PDs.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
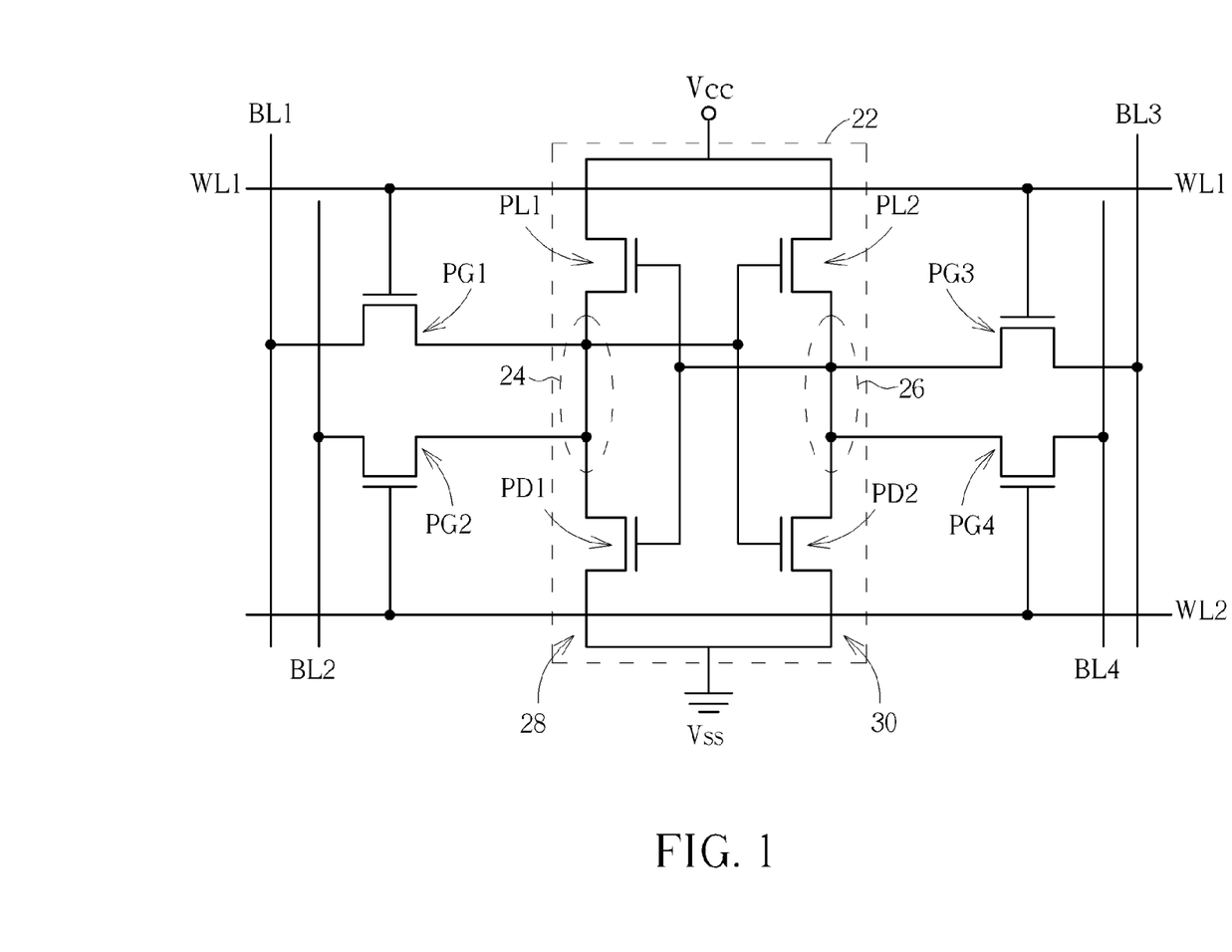
FIG. 1 illustrates a circuit diagram of an eight-transistor SRAM (8T-SRAM) cell according to a first preferred embodiment of the present invention.
Figure 2:
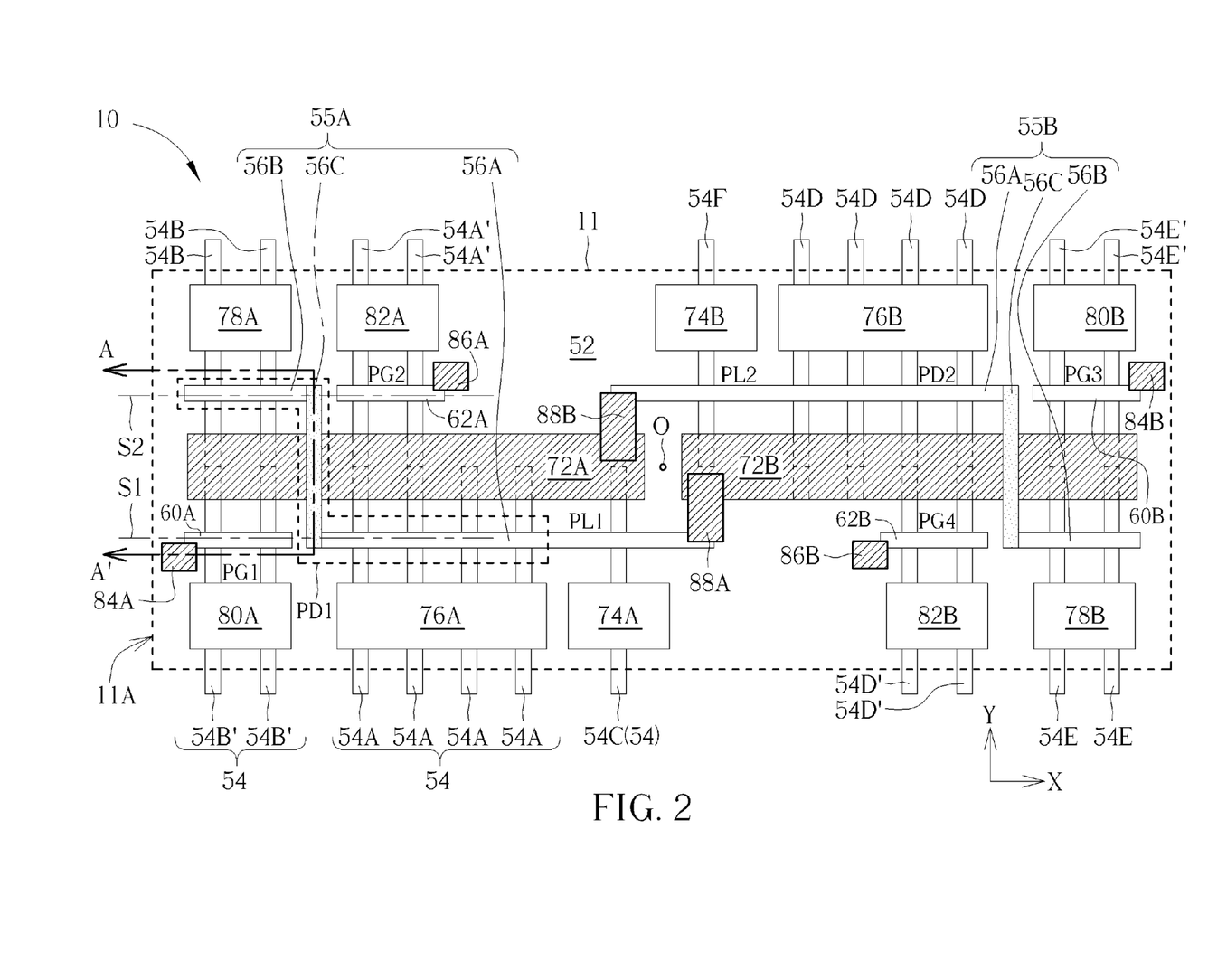
FIG. 2 illustrates a layout diagram of an 8T-SRAM according to a first preferred embodiment of the present invention.

Referring to FIGS. 1-2, FIG. 1 illustrates a circuit diagram of an eight-transistor SRAM (8T-SRAM) cell according to a first preferred embodiment of the present invention, and FIG. 2 illustrates a layout diagram of an 8T-SRAM according to the first preferred embodiment of the present invention.

As shown in FIGS. 1-2, the SRAM device of the present invention preferably includes at least one SRAM cell, each SRAM cell including an eight-transistor SRAM (8T-SRAM) cell 10.

In this embodiment, each 6T-SRAM cell 10 is composed of a first pull-up device PL1, a second pull-up device PL2, and a first pull-down device PD1, a second pull-down device PD2, a first pass gate device PG1, a second pass gate device PG2, a third pass gate device PG3 and a fourth pass gate device PG4. These eight transistors constitute a set of flip-flops. The first and the second pull-up devices PL1 and PL2, and the first and the second pull-down devices PD1 and PD2 constitute a latch circuit 22 that stores data in the storage nodes 24 and 26. Since the first and the second pull-up devices PL1 and PL2 act as power load devices, they can be replaced by resistors. Under this circumstance, the static random access memory becomes a four-transistor SRAM (4T-SRAM). In this embodiment, the first and the second pull-up devices PL1 and PL2 preferably share a source/drain region and electrically connect to a voltage source (voltage node) Vcc, and the first and the second pull-down devices PD1 and PD2 share a source/drain region and electrically connect to a voltage source (voltage node) Vss.

Preferably, the first and the second pull-up devices PL1 and PL2 of the 6T-SRAM cell 10 are composed of p-type metal oxide semiconductor (PMOS) transistors; the first and the second pull-down devices PD1 and PD2, the first pass gate devices PG1, the second pass gate devices PG2, the third pass gate devices PG3 and the fourth pass gate devices PG4 composed of n-type metal oxide semiconductor (NMOS) transistors, but not limited thereto. The first pull-up device PL1 and the first pull-down device PD1 constitute an inverter, which further form a series circuit 28. One end of the series circuit 28 is connected to a voltage source Vcc and the other end of the series circuit 28 is connected to a voltage source Vss. Similarly, the second pull-up device PL2 and the second pull-down device PD2 constitute another inverter and a series circuit 30. One end of the series circuit 30 is connected to the voltage source Vcc and the other end of the series circuit 30 is connected to the voltage source Vss. Each pass gate devices (including the first pass gate device PG1, the second pass gate device PG2, the third pass gate device PG3 and the fourth pass gate device PG4) configured with the two cross-coupled inverters respectively, wherein each of the at least one pull-up device (PLs), the at least one pull-down devices (PDs), and the at least two pass gate device (PGs) includes a fin field-effect transistor (FinFET).

The storage node 24 is connected to the respective gates of the second pull-down device PD2 and the second pull-up device PL2. The storage node 24 is also connected to the drains of the first pull-down device PD1, the first pull-up device PL1, the first pass gate device PG1 and the second pass gate device PG2. Similarly, the storage node 26 is connected to the respective gates of the first pull-down device PD1 and first the pull-up device PL1. The storage node 26 is also connected to the drains of the second pull-down device PD2, the second pull-up device PL2, the third pass gate device PG3 and the fourth pass gate device PG4. The gates of the first pass gate device PG1 and the third pass gate device PG2 are respectively coupled to a first word line (WL1); the gates of the second pass gate device PG2 and the fourth pass gate device PG4 are respectively coupled to a second word line (WL2); the source of the first pass gate device PG1 is coupled to a first bit line (BL1); the source of the second pass gate device PG2 is coupled to a second bit line (BL2); the source of the third pass gate device PG3 is coupled to a third bit line (BL3); and the source of the fourth pass gate device PG4 is coupled to a fourth bit line (BL4).

In this embodiment, an 8T-SRAM cell 10 is disposed on a substrate 52, such as a silicon substrate or silicon-on-insulator (SOI) substrate. The substrate may be a planar substrate, or a plurality of fin structures 54 may be formed on the substrate 52. In this embodiment, take an 8T-SRAM with fin structures 54 as an example, but the present invention is not limited thereto. In another case, the planar SRAM (the SRAM without comprising fin structures) may also be comprised within the scope of the present invention. In addition, a shallow trench isolation (STI, not shown) is disposed between each fin structure 54.

Generally, one fin transistor includes a gate structure crossing over at least one fin structure. However, if one gate structure crosses over a plurality of paralleled arranged fin structures, in the equivalent circuit, it's equal to a plurality of transistors connected in parallel to each other, thereby helping to increase the channel width of the fin transistor, and the read current (Iread) of one fin transistor can also be improved, so as to improve the operation speed of the whole SRAM (due to one SRAM includes a plurality of fin transistors).

A key feature of the present invention is that each inverter includes a step-shaped structure. More precisely, the invention further comprises at least two step-shaped (when viewed in a top view) gate structures 55A, 55B disposed on the substrate 52, and the two step-shaped structures 55A, 55B are symmetrically arranged (symmetrically arranged according to the center point O in FIG. 2). To simplify the description, this embodiment only describes one of the step-shaped structures 55A. Except for the symmetrical arrangement, the other characteristics of the two step-shaped structures 55A, 55B are completely identical.

Both the step-shaped structures 55A and the step-shaped structures 55B includes a first part 56A, a second part 56B and a bridge part 56C which is connected to the first part 56A and the second part 56B. More precisely, the first part 56A and the second part 56B of the step-shaped structure 55A are arranged along a first direction (such as the X-direction in FIG. 2), and the bridge part 56C of the step-shaped structure 55A is disposed between the first part 56A and the second part 56B and electrically connected to the first part 56A and the second part 56B, and is arranged along a second direction (such as the Y-direction in FIG. 2). The first direction and the second direction are preferably perpendicular to each other, but not limited thereto. In addition, the first part 56A and the second part 56B of the step-shaped structure 55A comprise different symmetry axes. In other words, the shortest distance between the first part 56A and the second part 56B of the step-shaped structure 55A is substantially equal to the length of the bridge part 56C (while the bridge part 56C is perpendicular to the first part 56A or the second part 56B).

It is noteworthy that the 8T-SRAM cell 10 is disposed within a specific range 11, in other words, the specific range 11 only includes one 8T-SRAM cell 10 disposed therein. The second part 56B is disposed adjacent to one edge of the specific range 11 (such as the edge 11A shown in FIG. 2).

The step-shaped structures 55A, 55B crosses over a plurality of fin structures 54. Here the fin structures 54 are labeled as the first fin structures 54A, the second fin structures 54B, the third fin structure 54C, the fourth fin structures 54D, the fifth fin structures 54E and the sixth fin structure 54F. In addition, this embodiment further includes at least one fin structure 54A', at least one fin structure 54B', at least one fin structure 54D' and at least one fin structure 54E' disposed on the substrate 52. The step-shaped structures 55A crosses over the first fin structures 54A, the second fin structures 54B and the third fin structure 54C, and the step-shaped structures 55B crosses over the fourth fin structures 54D, the fifth fin structures 54E and the sixth fin structure 54F. It is noteworthy that in this embodiment, there are more than one first fin structure 54A, second fin structure 54B, fourth fin structures 54D and fifth fin structures 54E, including four parallel arranged first fin structures 54A, two parallel arranged second fin structures 54B, one third fin structure 54C, four parallel arranged fourth fin structures 54D, two parallel arranged fifth fin structures 54E and one sixth fin structure 54F. However, the amount of the first fin structures 54A, the second fin structures 54B, the third fin structure 54C, the fourth fin structures 54D, the fifth fin structures 54E, the sixth fin structure 54F and the fin structures 54A', 54B', 54D' and 54E' may include any integer greater than or equal to 1, and it can be adjusted according to actual requirements.

In this embodiment, the first part 56A of the step-shaped structure 55A crosses over the first fin structures 54A and the third fin structure 54C, and the second part 56B of the step-shaped structure 55A crosses over the second fin structures 54B. The portion that the first part 56A crosses over the third fin structure 54C constitutes a gate of the first pull-up device PL1. In addition, the portion that the first part 56A crosses over the first fin structures 54A, and the portion that the second part 56B crosses over the second fin structures 54B constitutes a gate of the first the pull-down device PD1 (the range of the dotted line in FIG. 2 shows the range of the first the pull-down device PD1).

Therefore, in terms of the first pull-down device PD1, which comprises the step-shaped structure 55A, and the step-shaped structure 55A crosses over total six fin structures (including the first part 56A crosses four first fin structures 54A, and the second part 56B crosses two second fin structures 54B). In this way, in a limited range, the gate can cross more fin structures. This increases the channel width of the first pull-down device PD1, and the read current (Iread) of one first pull-down device PD1 can also be improved, so as to improve the read speed of the first pull-down device PD1.

Besides the step-shaped structures 55A and 55B, each inverter further includes a pass gate structure and a second pass gate structure. More precisely, the 8T-SRAM cell 10 also comprises two symmetrically arranged first pass gate structures 60A, 60B and two symmetrically arranged second pass gate structures 62A, 62B disposed on the substrate 52. To simplify the description, this embodiment only describes the first pass gate structures 60A and the second pass gate structures 62A. Except for the symmetrical arrangement, the other characteristics of the two first pass gate structures 60A, 60B and the two second pass gate structures 62A, 62B are completely identical.

Preferably, the first pass gate structure 60A is arranged along the first direction, and it's also arranged along the extending direction of the first part 56A. In other words, the first part 56A and the first pass gate structure 60A have a same symmetry axis S1. The first pass gate structure 60A crosses over the fin structures 54B', to constitute the gate of the first pass gate device PG1 mentioned above. In addition, the bridge part 56C is disposed between the first pass gate structure 60A and the first part 56A. Similarly, another first pass gate structure 60B crosses over other fin structures 54E', to constitute the gate of the third pass gate device PG3 mentioned above.

Similarly, the second pass gate structure 62A is also arranged along the first direction, and it's arranged along the extending direction of the second part 56B. In other words, the second part 56B and the second pass gate structure 62A have a same symmetry axis S2. The second pass gate structure 62A crosses over the fin structures 54A', to constitute the gate of the second pass gate device PG2 mentioned above. In addition, the bridge part 56C is disposed between the second pass gate structure 62A and the second part 56B. Similarly, another second pass gate structure 62B crosses over other fin structures 54D', to constitute the gate of the fourth pass gate device PG4 mentioned above.

Therefore, as shown in FIG. 2, when viewed in a top view, the step-shaped structures 55A and 55B has a "step-shaped" or a "Z-shaped" profile. The first pass gate structure 60A and the second pass gate structure 62A are disposed on two sides of the step-shaped structures 55A. For example, the first pass gate structure 60A is disposed on the left-lower side of the step-shaped structures 55A, and the second pass gate structure 62A is disposed on the right-upper side of the step-shaped structures 55A.

Besides the fin structures and the gate structures mentioned above, the 8T-SRAM cell 10 further includes a plurality of contact structures, including two symmetrically arranged extending contact structures 72A and 72B, the extending contact structure 72A crosses over each first fin structure 54A, each second fin structure 54B and each the third fin structure 54C, the extending contact structure 72B crosses over each fourth fin structure 54D, each fifth fin structure 54E and each sixth fin structure 54F, to electrically connect each parallel arranged fin structure together. Please also refer to FIG. 1, where the extending contact structure 72A electrically connects to the drain of the first pull-down device PD1, the first pull-up device PL1, the first pass gate device PG1 and the second pass gate device PG2. Besides, when viewed in a top view, the shape of the extending contact structures 72A, 72B may be a strip shape or other shapes (such as L-shaped), and the present invention is not limited thereto.

Figure 3:
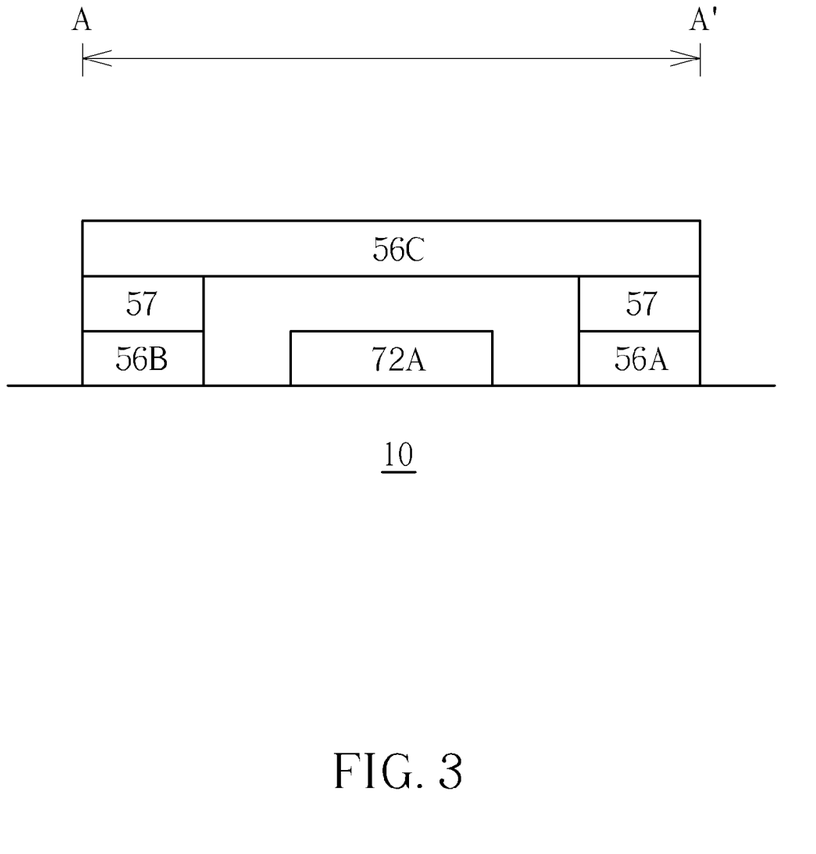
FIG. 3 shows a cross section diagram along the cross section line A-A' of FIG. 2 according to a first preferred embodiment of the present invention.

In addition, FIG. 3 shows a cross section diagram along the cross section line A-A' in FIG. 2. As shown in FIG. 3, the bridge part 56C and the extending contact structures 72A, 72B are disposed in different layers (FIG. 3 only shows the extending contact structure 72A as an example), the bridge part 56C crosses above the extending contact structure 72A or the extending contact structure 72B, but is not electrically connected to the extending contact structure 72A or the extending contact structure 72B. Furthermore, at least one contact structure 57 may be disposed between the bridge part 56C and the extending contact structure 72A, or disposed between the bridge part 56C and the extending contact structure 72B. In this embodiment, the bridge part 56C includes a high-k layer (not shown) and a metal electrode (not shown) disposed on the high-k layer. But not limited thereto.

Figure 4:
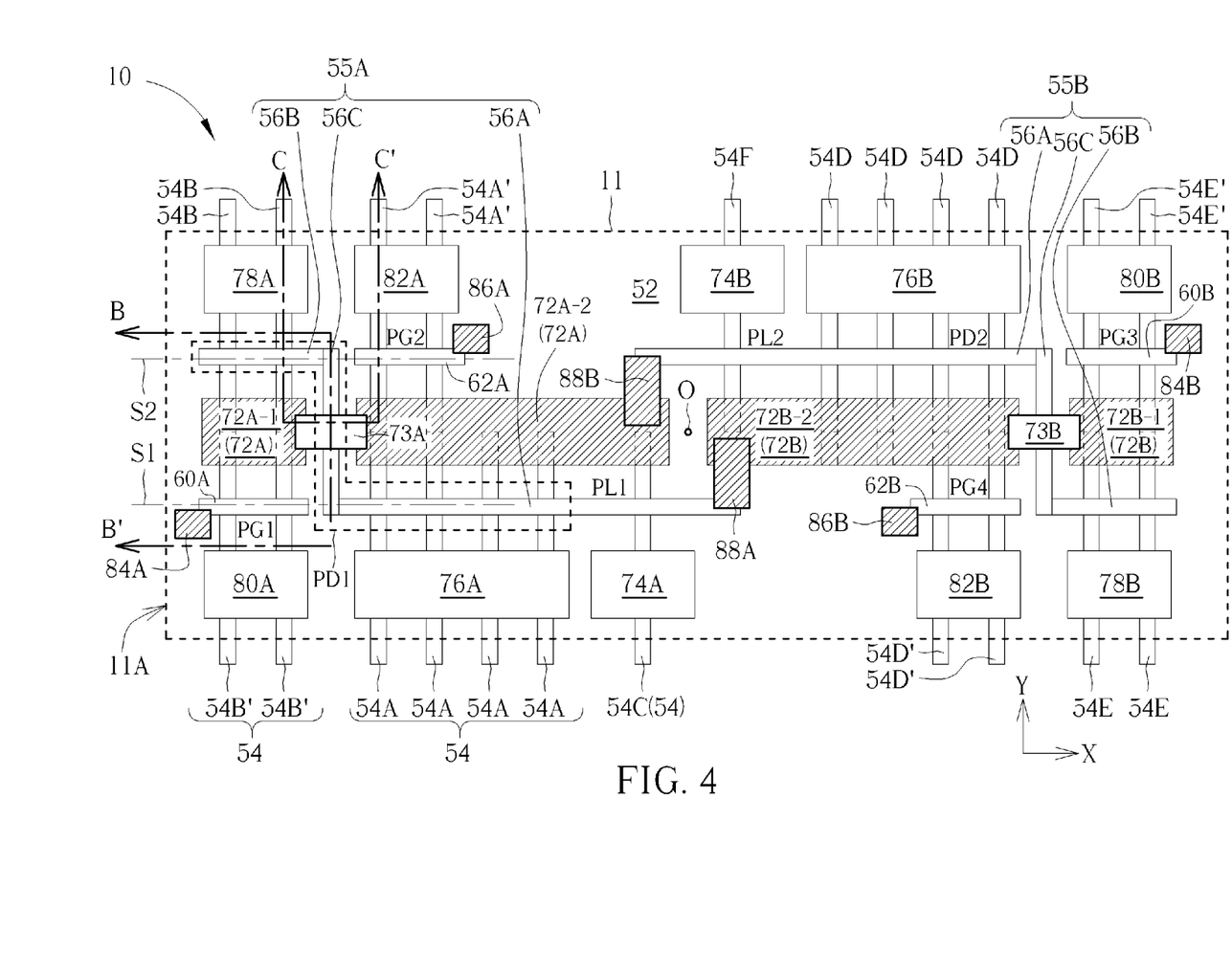
FIG. 4 illustrates a layout diagram of an 8T-SRAM according to another preferred embodiment of the present invention.
Figure 5:
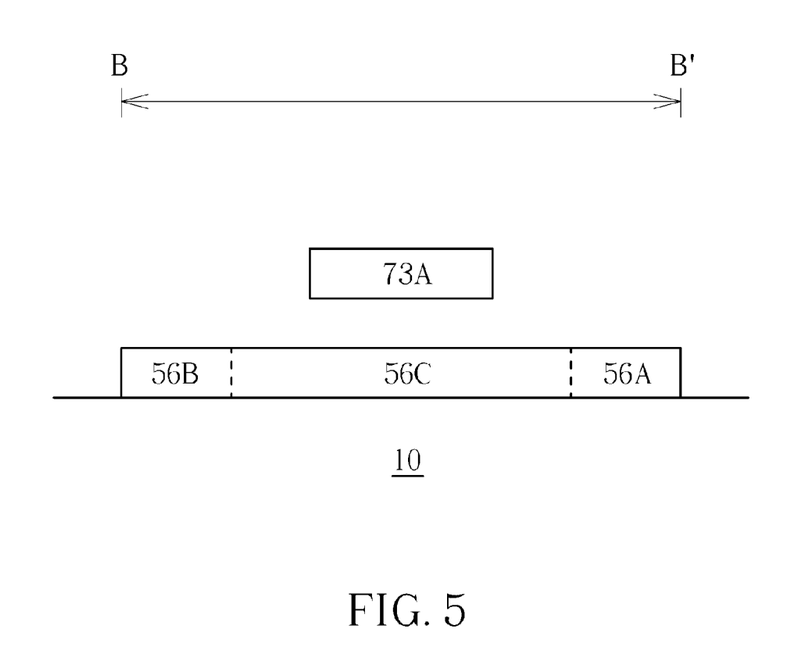
FIG. 5 shows a cross section diagram along the cross section line B-B' of FIG. 4.
Figure 6:
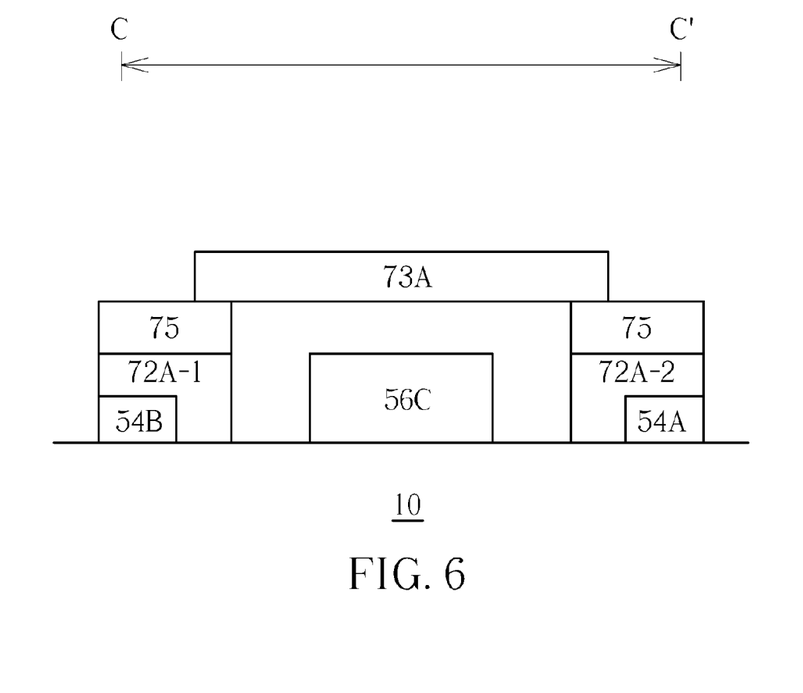
FIG. 6 shows a cross section diagram along the cross section line C-C' of FIG. 4.

In another case of the present invention, the step-shaped structure 55A (and/or the step-shaped structure 55B) is a monolithically formed structure. In other words, the bridge part 56C, the first part 56A and the second part 56B are formed simultaneously and disposed in a same layer. In this case, the extending contact structures 72A, 72B cross above the bridge part 56C, but is not electrically connected to the bridge part 56C. More precisely, FIG. 4 illustrates a layout diagram of an 8T-SRAM according to another preferred embodiment of the present invention. In this embodiment, the step-shaped structure 55A (and/or the step-shaped structure 55B) is a monolithically formed structure. The extending contact structure 72A includes two parts: an extending contact structure 72A-1 and an extending contact structure 72A-2, disposed on two sides of the bridge part 56C of the step-shaped structure 55A. Similarly, the extending contact structure 72B includes two parts: an extending contact structure 72B-1 and an extending contact structure 72B-2, disposed on two sides of the bridge part 56C of the step-shaped structure 55B. Furthermore, this embodiment includes two bridge structures 73A and 73B, please refer to FIGS. 5-6, FIG. 5 shows a cross section diagram along the cross section line B-B' of FIG. 4, and FIG. 6 shows a cross section diagram along the cross section line C-C' of FIG. 4. The bridge structure 73A crosses above the bridge part 56C of the step-shaped structure 55A, and is electrically connected to the extending contact structure 72A-1 and the extending contact structure 72A-2. The bridge structure 73B crosses above the bridge part 56C of the step-shaped structure 55B, and is electrically connected to the extending contact structure 72B-1 and the extending contact structure 72B-2. In addition, at least one contact structure 75 may be disposed between the bridge structure 73A and the extending contact structure 72A-1, or disposed between the bridge structure 73A and the extending contact structure 72A-1.

Furthermore, the other contact structures disposed on the substrate 52 include:

The contact structures 74A, 74B, the contact structure 74A electrically connected to each third fin structure 54C, and also electrically connected to the voltage source Vcc, the contact structure 74B electrically connected to each sixth fin structure 54F, and also electrically connected to the voltage source Vcc (please refer to FIG. 1, where the contact structures 74A, 74B are electrically connected to the source of the first pull-up device PL1 and the second pull-up device PL2 to the voltage source Vcc).

The contact structures 76A, 76B, the contact structure 76A crosses over each first fin structure 54A, and is electrically connected to the voltage source Vss, the contact structure 76B crosses over each fourth fin structure 54D, and is electrically connected to the voltage source Vss (please refer to FIG. 1, where the contact structures 76A, 76B are electrically connected to the source of the first pull-down device PD1 and the second pull-down device PD2 to the voltage source Vss).

The contact structures 78A, 78B, the contact structure 78A crosses over each second fin structure 54B, and is electrically connected to the voltage source Vss, the contact structure 78B crosses over each fifth fin structure 54E, and is electrically connected to the voltage source Vss (please refer to FIG. 1, where the contact structures 78A, 78B are electrically connected to the source of the first pull-down device PD1 and the second pull-down device PD2 to the voltage source Vss).

The contact structures 80A, 80B, the contact structure 80A crosses over each second fin structure 54B, and is electrically connected to the bit line BL1, the contact structure 80B crosses over each fifth fin structure 54E, and is electrically connected to the bit line BL3 (please refer to FIG. 1, where the contact structure 80A is electrically connected to the source of the first pass gate device PG1 to the bit line BL1, and the contact structure 80B is electrically connected to the source of the third pass gate device PG3 to the bit line BL3).

The contact structures 82A, 82B, the contact structure 82A crosses over each first fin structure 54A, and is electrically connected to the bit line BL2, the contact structure 82B crosses over each fourth fin structure 54D, and is electrically connected to the bit line BL4 (please refer to FIG. 1, where the contact structure 82A is electrically connected to the source of the second pass gate device PG2 to the bit line BL2, and the contact structure 82B is electrically connected to the source of the fourth pass gate device PG4 to the bit line BL4).

The contact structures 84A, 84B, the contact structure 84A disposed on each first pass gate structure 60A, and electrically connected to the word line WL1, the contact structure 84B disposed on each first pass gate structure 60B, and electrically connected to the word line WL1 (please refer to FIG. 1, where the contact structure 84A is electrically connected to the gate of the first pass gate device PG1 and the third pass gate device PG3 to the word line WL1).

The contact structures 86A, 86B, the contact structure 86A disposed on each second pass gate structure 62A, and electrically connected to the word line WL2, the contact structure 86B disposed on each second pass gate structure 62B, and electrically connected to the word line WL2 (please refer to FIG. 1, where the contact structure 86A is electrically connected to the gate of the second pass gate device PG2 and the fourth pass gate device PG4 to the word line WL2).

The contact structures 88A, 88B, the contact structure 88B disposed on the third fin structure 54C, and electrically connected to the step-shaped structure 55A and the extending contact structure 72A, the contact structure 88A disposed on the sixth fin structure 54F, and electrically connected to the step-shaped structure 55B and the extending contact structure 72B (please refer to FIG. 1, where the contact structure 88A is electrically connected to the gate of the first pull-up device PL1 to the storage node 26, and the contact structure 88B is electrically connected to the gate of the second pull-up device PL2 to the storage node 24). In addition, the contact structure 88A and the extending contact structure 72A may be formed in a same level and contact to each other directly, therefore, the contact structure 88A and the extending contact structure 72A are a monolithically formed structure. Similarly, the contact structure 88B and the extending contact structure 72B may be a monolithically formed structure too. Besides, the contact structures mentioned above are also arranged symmetrically, and will not be described again.

A key feature of this embodiment is that the first part 56A and the second part 56B of the step-shaped structure 55A (or the step-shaped structure 55B) have different symmetry axes, but they cross over the first fin structures 54A and the second fin structures 54B respectively, to constitutes a gate of the first the pull-down device PD1.

In terms of the first pull-down device PD1, which comprises the step-shaped structure 55A, and the step-shaped structure 55A crosses over total six fin structures (including the first part 56A crossing four first fin structures 54A, and the second part 56B crossing two second fin structures 54B). In other words, the gate structure of first pull-down device PD1 is not limited to being a strip-shaped structure, and it can be designed to be a step-shaped structure or other shapes. In this way, in a limited range, the gate can cross more fin structures. This increases the channel width of the first pull-down device PD1, and the read current (Iread) of one first pull-down device PD1 can also be improved, so as to improve the read speed of the first pull-down device PD1.

The following description will detail the different embodiments of the SRAM of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 7:
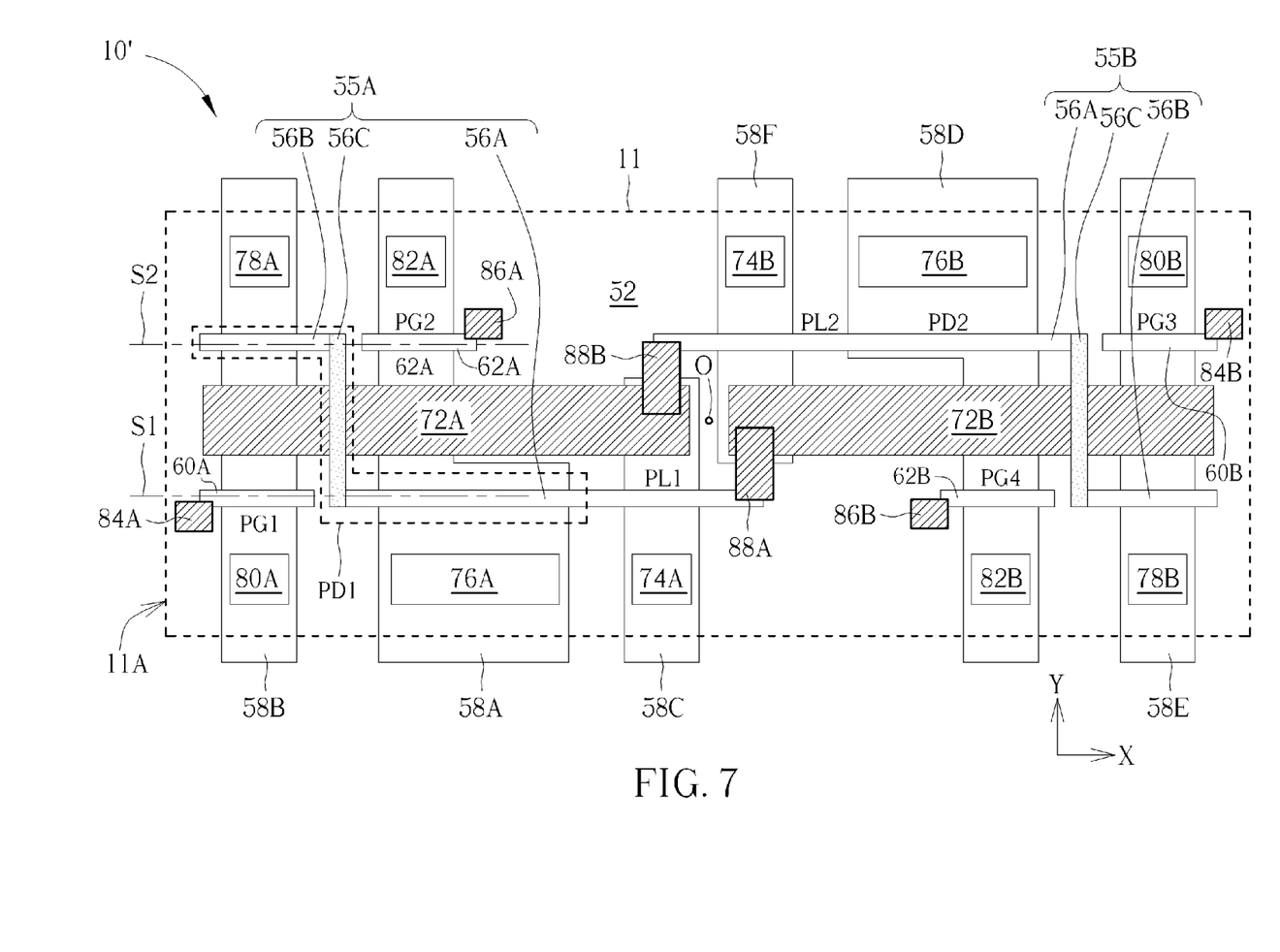
FIG. 7 illustrates a layout diagram of a SRAM according to a second preferred embodiment of the present invention.

Each embodiment mentioned above includes a plurality of fin structures 54 disposed on the substrate 52. However, in another embodiment of the present invention, there are no fin structures formed on the substrate, but a plurality of diffusion regions are formed in the substrate through an ion implantation process. Next, the processes mentioned above, including forming the step-shaped structures, forming the first pass gate structures, forming the second pass gate structures and forming the contact structures, are performed. In other words, in the following embodiment, planar transistors are used to replace the finFET mentioned above. Please refer to FIG. 7. FIG. 7 illustrates a layout diagram of an 8T-SRAM according to another preferred embodiment of the present invention. In this embodiment, a 8T-SRAM cell 10' does not includes the fin structures, and symmetrically arranged two first diffusion regions 58A, two second diffusion regions 58B, two third diffusion regions 58C, two diffusion regions 58D, two diffusion regions 58E and two diffusion regions 58F are formed in the substrate 52 through an ion implantation process. Next, similar to the processes mentioned in the first preferred embodiment, the step-shaped structures 55A, 55B, the first pass gate structures 60A, 60B, the second pass gate structures 62A, 62B, the extending contact structures 72A, 72B and a plurality of contact structures (including the contact structures 74A, 74B, 76A, 76B, 78A, 78B, 80A, 80B, 82A, 82B, 84A, 84B, 86A, 86B, 88A and 88B) are formed.

The difference between this embodiment and the first preferred embodiment is in this embodiment, there are no fin structures formed on the substrate, but a plurality of diffusion regions (including the first diffusion regions 58A, the second diffusion regions 58B, the third diffusion regions 58C, the fourth diffusion regions 58D, the fifth diffusion regions 58E and the sixth diffusion regions 58F) are formed in the substrate 52. Except for the features mentioned above, the other components, material properties, and manufacturing method of this embodiment are similar to the first preferred embodiment detailed above (it can also refer to FIG. 2) and will not be redundantly described.

The circuit diagram of this embodiment is similar to the circuit diagram of the first preferred embodiment (please refer to FIG. 1), includes two inverters cross-coupled for data storage, each inverter includes at least one pull-up device (PLs), at least one pull-down devices (PDs) and at least two pass gate devices (PGs). More precisely, this embodiment includes a first pull-up device PL1, a second pull-up device PL2, and a first pull-down device PD1, a second pull-down device PD2, a first pass gate device PG1, a second pass gate device PG2, a third pass gate device PG3 and a fourth pass gate device PG4.

Each inverter includes a step-shaped structure. More precisely, the step-shaped structures 55A, 55B crosses over a plurality of diffusion regions. Similar to the embodiment mentioned above, the step-shaped structure 55A includes a first part 56A, a second part 56B and a bridge part 56C. The first part 56A and the second part 56B of the step-shaped structure 55A are arranged along a first direction (such as the X-direction), and the bridge part 56C of the step-shaped structure 55A is disposed between the first part 56A and the second part 56B and electrically connected to the first part 56A and the second part 56B, and is arranged along a second direction (such as the Y-direction).

The step-shaped structures 55A crosses over the first diffusion region 58A, the second diffusion region 58B and the third diffusion region 58C, and the step-shaped structures 55B crosses over the fourth diffusion region 58D, the fifth diffusion region 58E and the sixth diffusion region 58F.

In this embodiment, the first part 56A of the step-shaped structure 55A crosses over the first diffusion region 58A and the third diffusion region 58C, and the second part 56B of the step-shaped structure 55A crosses over the second diffusion region 58B. The portion that the first part 56A crosses over the third diffusion region 58C constitutes a gate of the first the pull-up device PL1. In addition, the portion that the first part 56A crosses over the first diffusion region 58A, and the portion that the second part 56B crosses over the second diffusion region 58B constitutes a gate of the first the pull-down device PD1 (the range of the dotted line in FIG. 7 shows the range of the first the pull-down device PD1)

It is noteworthy that the 8T-SRAM cell 10' is disposed within a specific range 11, in other words, the specific range 11 only includes one 8T-SRAM cell 10' disposed therein. The second part 56B is disposed adjacent to one edge of the specific range 11 (such as the edge 11A shown in FIG. 7).

Besides the step-shaped structures 55A and 55B, each inverter further includes a first pass gate structure and a second pass gate structure. More precisely, the 8T-SRAM cell 10' also comprises two symmetrically arranged first pass gate structures 60A, 60B and two symmetrically arranged second pass gate structures 62A, 62B disposed on the substrate 52. Preferably, the first pass gate structure 60A is arranged along the first direction, and it's also arranged along the extending direction of the first part 56A. In other words, the first part 56A and the first pass gate structure 60A have a same symmetry axis S1. The first pass gate structure 60A crosses over the second diffusion region 58B, to constitute the gate of the first pass gate device PG1 mentioned above. In addition, the bridge part 56C is disposed between the first pass gate structure 60A and the first part 56A. Similarly, another first pass gate structure 60B crosses over other fifth diffusion region 58E, to constitute the gate of the third pass gate device PG3 mentioned above.

Similarly, the second pass gate structure 62A is also arranged along the first direction, and it's arranged along the extending direction of the second part 56B. In other words, the second part 56B and the second pass gate structure 62A have a same symmetry axis S2. The second pass gate structure 62A crosses over the first diffusion region 58A, to constitute the gate of the second pass gate device PG2 mentioned above. In addition, the bridge part 56C is disposed between the second pass gate structure 62A and the second part 56B. Similarly, another second pass gate structure 62B crosses over other fourth diffusion region 58D, to constitute the gate of the fourth pass gate device PG4 mentioned above.

Besides the diffusion regions and the gate structures mentioned above, the 8T-SRAM cell 10' further includes a plurality of contact structures, including two symmetrically arranged extending contact structures 72A and 72B, the extending contact structure 72A crosses over each first diffusion region 58A, each second diffusion region 58B and each the third diffusion region 58C, the extending contact structure 72B crosses over each fourth diffusion region 58D, each fifth diffusion region 58E and each sixth diffusion region 58F, to electrically connect each parallel arranged fin structure together. Please also refer to FIG. 1, where the extending contact structure 72A electrically connects to the drain of the first pull-down device PD1, the first pull-up device PL1, the first pass gate device PG1 and the second pass gate device PG2. Besides, when viewed in a top view, the shape of the extending contact structures 72A, 72B may be a strip shape or other shapes (such as L-shaped), and the present invention is not limited thereto.

Figure 8:
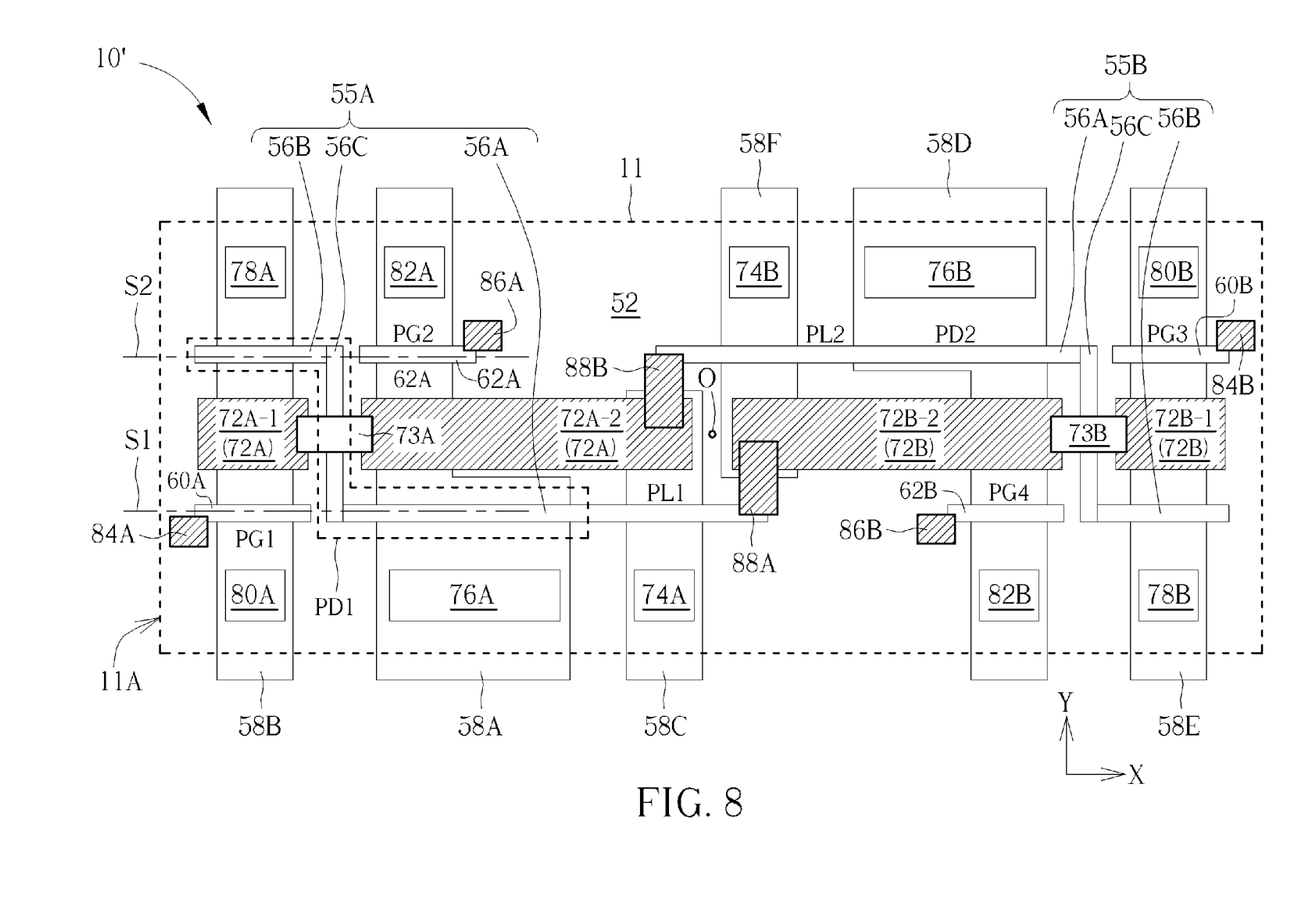
FIG. 8 illustrates a layout diagram of a SRAM according to another embodiment of the present invention.

In addition, the bridge part 56C crosses above the extending contact structure 72A or the extending contact structure 72B (the cross section can also refer to FIG. 3), but is not electrically connected to the extending contact structure 72A or the extending contact structure 72B. In another case of the present invention, please refer to FIG. 8, FIG. 8 illustrates a layout diagram of an 8T-SRAM according to another preferred embodiment of the present invention. The step-shaped structure 55A (and/or the step-shaped structure 55B) is a monolithically formed structure. The extending contact structure 72A includes two parts: an extending contact structure 72A-1 and an extending contact structure 72A-2, disposed on two sides of the bridge part 56C of the step-shaped structure 55A. Similarly, the extending contact structure 72B includes two parts: an extending contact structure 72B-1 and an extending contact structure 72B-2, disposed on two sides of the bridge part 56C of the step-shaped structure 55B. Furthermore, this embodiment includes two bridge structures 73A and 73B. The bridge structure 73A crosses above the bridge part 56C of the step-shaped structure 55A, and is electrically connected to the extending contact structure 72A-1 and the extending contact structure 72A-2. The bridge structure 73B crosses above the bridge part 56C of the step-shaped structure 55B, and is electrically connected to the extending contact structure 72B-1 and the extending contact structure 72B-2 (the cross section diagrams can refer to FIGS. 5-6, but the fin structures 54A and 54B shown in FIG. 6 are not formed in this embodiment).

Besides the extending contact structure 72A and 72B, the positions of others contact structures disposed on the substrate 52 (including the contact structures 74A, 74B, 76A, 76B, 78A, 78B, 80A, 80B, 82A, 82B, 84A, 84B, 86A, 86B, 88A and 88B) correspond to the position of each contact structure in the first preferred embodiment. But in this embodiment, each contact structure is disposed on a diffusion region, but not disposed on a fin structure. Except for the features mentioned above, the other components, material properties, and manufacturing method of this embodiment are similar to the first preferred embodiment detailed above and will not be redundantly described.

A key feature of the present invention is the gate structure of pull-down device PDs is not limited to being a strip-shaped structure, and it can be designed to be a step-shaped structure or other shapes. In this way, in a limited range, the gate can cross more fin structures. This increases the channel width of the pull-down device PDs, and the read current (Iread) of one first pull-down device PD1 can also be improved, so as to improve the read speed of the pull-down device PDs.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A layout pattern of a static random access memory, comprising:
    a first inverter and a second inverter cross-coupled for data storage, each inverter including at least one pull-up device (PLs) and at least one pull-down devices (PDs);
    at least two pass gate devices (PGs) configured with the two cross-coupled inverters respectively, wherein each of the at least one pull-up device (PLs), the at least one pull-down devices (PDs), and the at least two pass gate devices (PGs) includes a fin field-effect transistor (Fin-FET);
    a plurality of fin structures disposed on the substrate, the fin structures comprising at least one first fin structure, at least one second fin structure, at least one third fin structure, at least one fourth fin structure and at least one fifth fin structure;
    each inverter comprising a step-shaped structure disposed on the substrate, the step-shaped structure comprising a first part and a second part arranged along a first direction, and a bridge part connected to the first part and the second part, the bridge part is arranged along a second direction, wherein the first direction is perpendicular to the second direction, and wherein the first part crosses over the at least one first fin structure, and the second part crosses over the at least one second fin structure to form the at least one pull-down devices (PDs), wherein the first part crosses over the at least one third fin structure to form the at least one pull-up devices (PLs);
    each inverter comprising a first pass gate structure and a second pass gate structure disposed on the substrate, the first pass gate structure and the first part of the step-shaped structure being arranged along a same direction, and the first pass gate structure and the first part of the step-shaped structure comprising a same symmetry axis, the second pass gate structure and the second part of the step-shaped structure being arranged along a same direction, and the second pass gate structure and the second part of the step-shaped structure comprising a same symmetry axis, wherein the first pass gate structure crosses over the at least one fourth fin structure to form one of the two pass gate devices (PGs), and the second pass gate structure crosses over the at least one fifth fin structure to form another one of the two pass gate devices (PGs); and a first extending contact structure crossing over the at least one first fin structure and the at least one second fin structure.

2. The layout pattern of claim 1, wherein the first part and the second part of the step-shaped structure comprise different symmetry axes.

3. The layout pattern of claim 1, wherein the first extending contact structure further crosses over the at least one third fin structure.

4. The layout pattern of claim 1, further comprising at least one word line electrically connected to the first pass gate structure.

5. The layout pattern of claim 1, wherein the bridge part of the step-shaped structure is disposed between the first part of the step-shaped structure and the first pass gate structure.

6. The layout pattern of claim 1, wherein the bridge part of the step-shaped structure is disposed between the second part of the step-shaped structure and the second pass gate structure.

7. The layout pattern of claim 1, wherein the layout pattern of the SRAM is disposed within a specific range, the specific range has an edge, and the second part of the step-shaped structure and the first pass gate structure are disposed adjacent to the edge.

8. The layout pattern of claim 1, further comprising a second step-shaped structure, wherein the step-shaped structure and the second step-shaped structure are symmetrically arranged.

9. The layout pattern of claim 1, wherein the bridge part of the step-shaped structure crosses above the at least one first extending contact structure.

10. The layout pattern of claim 1, wherein the first part, the second part and the bridge part of the step-shaped structure are a monolithically formed structure, and further comprising a second bridge part crossing above the bridge part of the step-shaped structure.

* * * * *